United States Patent
Shibata et al.

(10) Patent No.: US 6,183,555 B1
(45) Date of Patent: Feb. 6, 2001

(54) SURFACE ACOUSTIC WAVE DEVICE, SUBSTRATE THEREFOR, AND METHOD OF MANUFACTURING THE SUBSTRATE

(75) Inventors: Tomohiko Shibata, Kasugai; Yukinori Nakamura, Nagoya, both of (JP)

(73) Assignee: NGK Insulators, Ltd. (JP)

(*) Notice: Under 35 U.S.C. 154(b), the term of this patent shall be extended for 0 days.

(21) Appl. No.: 09/309,515

(22) Filed: May 11, 1999

Related U.S. Application Data (62) Division of application No. 08/936,614, filed on Sep. 24, 1997.

(30) Foreign Application Priority Data

Sep. 27, 1996 (JP) ...................................... 8-256095

(51) Int. Cl.$^7$ .................................................. C30B 23/00
(52) U.S. Cl. ........................... 117/98; 117/104; 117/105; 117/107; 310/313 R
(58) Field of Search ................. 117/84, 86, 89, 117/98, 902, 950; 310/313, 360

(56) References Cited

U.S. PATENT DOCUMENTS

| | | | |
|---|---|---|---|
| 4,354,130 | 10/1982 | Ono et al. ........................ | 310/313 A |
| 4,868,444 | 9/1989 | Shibata et al. ................... | 310/313 A |
| 5,498,920 | 3/1996 | Okano et al. .................... | 310/313 A |
| 5,571,603 | * 11/1996 | Utumi et al. ..................... | 428/212 |
| 5,587,593 | * 12/1996 | Koide et al. ..................... | 257/94 |

FOREIGN PATENT DOCUMENTS

| | | |
|---|---|---|
| 0 313 025 | 4/1989 | (EP) . |
| 2 181 917 | 4/1987 | (GB) . |
| 4-323880 | 11/1992 | (JP) . |

* cited by examiner

Primary Examiner—Robert Kunemund
Assistant Examiner—Lan Vinh

(57) ABSTRACT

A sapphire single crystal wafer 11 having a diameter not less than two inches and having an off-angled surface which is obtained by rotating an R (1–102) surface about a [11–20] axis by a given off-angle is introduced in a CVD apparatus, and a double-layer structure of first and second aluminum single crystal layers 12 and 13 is deposited on the off-angled surface of the sapphire single crystal wafer by MOCVD. The thus deposited aluminum single crystal layer 13 has (1–210) surface. The first aluminum nitride single crystal layer 12 serves as a buffer layer and has a thickness of 5–50 nm, and the second aluminum nitride single crystal layer 13 has a thickness not less than 1 $\mu$m. The off-angle is preferably set to a value not less than ±1°, much preferably a value ±2°, more preferably a value not less than –3°, and particularly preferable to a value within a range from –2°–+10°. The thus obtained aluminum nitride single crystal layer 12, 13 has no clack formed therein, has an excellent piezo-electric property, and has a high propagating velocity for surface acoustic wave.

7 Claims, 7 Drawing Sheets

FIG_8

FIG_9

SURFACE ACOUSTIC WAVE DEVICE, SUBSTRATE THEREFOR, AND METHOD OF MANUFACTURING THE SUBSTRATE

This application is a division of Ser. No. 08/936,614, filed Sep. 24, 1997.

BACKGROUND OF THE INVENTION

1. Field of the Invention

The present invention relates to a substrate for use in a surface acoustic wave device, and more particularly to a substrate comprising a sapphire single crystal substrate consisting of $\alpha$-$Al_2O_3$ and an aluminum nitride single crystal layer formed on a surface of the sapphire single crystal substrate by a metal organic chemical vapor deposition (MOCVD).

The present invention also relates to a method of manufacturing the above mentioned substrate for use in a surface acoustic wave device as well as a surface acoustic wave device comprising the above mentioned substrate.

2. Related Art Statement

Heretofore, substrates of surface acoustic wave devices have been generally made of quartz, $LiNbO_3$, $LiTaO_2$, $Li_2B_4O_7$ and others. These substrate materials have been utilized owing to a reason that they have excellent electromechanical coupling coefficient $K^2$ and temperature coefficient of delay time (TCD) which are important transmission properties of the surface acoustic wave device. On the other hand, the application of the surface acoustic wave devices has become wider and wider, and it has been required to provide a surface acoustic wave device having a very high operation frequency. However, a propagating velocity of the surface acoustic wave in the above mentioned substrate materials is about 3000–5000 m/sec, and in order to realize a surface acoustic wave device having an operation frequency in the order of GHz, it is required to provide a substrate having a propagating velocity for the surface acoustic wave not lower than 5000–6000 m/sec.

As stated above, in order to realize a surface acoustic wave device having a very high operation frequency, it is necessary to use a substrate having a high propagating velocity. For this purpose, it has been proposed to use a substrate made of aluminum nitride (AlN). An electromechanical coupling coefficient $K^2$ of the aluminum nitride substrate is about 0.8% which is higher than that of quartz by about five times, and a temperature coefficient of delay time TCD of the aluminum nitride substrate is not larger than 20 ppm/°C. However, aluminum nitride has a very high melting point, and therefore it is difficult to obtain a large bulk aluminum nitride single crystal. Due to this fact, in general, an aluminum nitride single crystal layer is formed on a sapphire single crystal substrate made of $\alpha$-$Al_2O_3$. Such a sapphire single crystal substrate has been used owing to a reason that it is easily available and its lattice constant does not differ largely from that of the aluminum nitride.

As stated above, it has been proposed to use the substrate in which the aluminum nitride layer is deposited on the sapphire substrate. The inventors of the instant application have conducted various experiments, in which after performing an initial nitriding treatment by exposing an R(1–102) surface of a sapphire substrate to an atmosphere of ammonia to form a very thin aluminum nitride single crystal film, an aluminum nitride single crystal layer is deposited on the aluminum nitride single crystal film by the metal organic chemical vapor deposition (MOCVD). For instance, a sapphire single crystal substrate was placed in a CVD apparatus, and then trimethylaluminum (TMA) and ammonia (NH3) were introduced into the CVD apparatus to deposit an aluminum nitride single crystal layer on the sapphire substrate. It was confirmed that the aluminum nitride single crystal layer thus formed by the MOCVD method has a good electromechanical coupling coefficient $K^2$.

In the experiments, use was made of a very small sapphire substrate of a square shape having a side of 5 mm. In order to manufacture substrates for surface acoustic wave devices on a practically acceptable large scale, it is necessary to use a sapphire wafer not less than two inches (50.8 mm). That is to say, an aluminum nitride single crystal layer has to be formed on a surface of a two inch sapphire single crystal wafer, then a desired electrode pattern has to be formed on the aluminum nitride layer, and finally the sapphire single crystal wafer has to be divided into chips by slicing. This process is similar to that of manufacturing semiconductor devices on a mass production scale.

In one of the experiments conducted by the inventors, use was made of a two inch sapphire single crystal wafer having a thickness of 300–500 $\mu$m, a first aluminum nitride single crystal layer was formed on the sapphire wafer by means of the above mentioned initial nitriding treatment, a second aluminum nitride single crystal layer was formed on the first aluminum nitride single crystal layer having a thickness not less than 1 $\mu$m by means of the above mentioned MOCVD process, and finally the sapphire single crystal wafer was divided into a number of surface acoustic wave devices. In the final device, the above first and second aluminum nitride single crystal layers were united together to form a single aluminum nitride single crystal layer. It has been experimentally confirmed that a number of clacks were formed in the aluminum nitride single crystal layer with a mutual spacing of about 1 mm. Surface acoustic wave devices were manufactured using the thus obtained substrates. Then, it was experimentally confirmed that propagation loss of the thus obtained surface acoustic wave devices was very large and the property of the device is deteriorated. In this manner, it is experimentally confirmed that practically usable surface acoustic wave devices could not be manufactured by using the above mentioned sapphire single crystal substrate.

In a field of manufacturing light emitting semiconductor devices, it has been known to use a substrate including a sapphire single crystal substrate and a III–V compound single crystal layer such as GaN and AlN single crystal layer formed on the sapphire single crystal substrate. In order to prevent clacks from being formed in the III–V compound single crystal layer, it has been proposed to form a thin buffer layer on the sapphire single crystal substrate prior to the formation of the III–V compound single crystal layer. The inventors have introduced this method in the formation of the substrate for the surface acoustic wave devices. That is to say, a very thin buffer layer consisting of an aluminum nitride single crystal film having a thickness of about 5–50 nm was first formed on a sapphire single crystal substrate, and then a thick aluminum nitride layer was formed on the buffer layer. In this case, during the formation of the relatively thin first aluminum nitride single crystal layer, a surface temperature of the sapphire substrate was kept to a lower temperature such as 300–450° C., and then the substrate was heated to 900–1100° C. during the formation of the relatively thick second aluminum nitride single crystal layer. The thus formed aluminum nitride layer was free from clacks. However, its electromechanical coupling coefficient $K^2$ was reduced to substantially zero and the aluminum nitride single crystal layer looses its piezoelectric property.

It is apparent that such a substrate could never by used as the substrate for the surface acoustic wave device. In the light emitting semiconductor device, the loss of the piezo-electric property does not matter at all, but in the surface acoustic wave device, the piezo-electric property is indispensable. A reason for the disappearance of the piezo-electric property by providing the buffer layer could not yet be clarified, but upon observing the microstructure of the surface of the aluminum nitride single crystal layer, it has been confirmed that many twins were formed in the surface.

SUMMARY OF THE INVENTION

The present invention has for its object to provide a novel and useful substrate for a surface acoustic wave device, in which there is not produced clack in a surface of an aluminum nitride single crystal layer deposited on a sapphire single crystal substrate and a very high electromechanical coupling coefficient $K^2$ can be attained even by using a sapphire single crystal wafer having a size not smaller than two inches.

It is another object of the invention to provide a method of manufacturing the above mentioned substrate for use in a surface acoustic wave device at a low cost. It is still another object of the invention to provide a surface acoustic wave device, which has excellent properties such as high operation frequency and high electromechanical coupling coefficient $K^2$.

According to the invention, a substrate for use in a surface acoustic wave device comprising a sapphire single crystal substrate made of $\alpha\text{-}Al_2O_3$ and an aluminum nitride single crystal layer formed on a surface of said sapphire single crystal substrate, wherein said surface of the sapphire single crystal substrate is formed by an off-angled surface that is obtained by rotating an R(1–102) surface about a [11–20] axis by a given off-angle, and said aluminum nitride single crystal layer is formed by an aluminum nitride single crystal layer deposited on said off-angled surface of the sapphire single crystal substrate by a metal organic chemical vapor deposition to have a (1–210) surface.

According to the invention, a method of manufacturing a substrate for use in a surface acoustic wave device comprises the steps of:

preparing a sapphire single crystal substrate made of $\alpha\text{-}Al_2O_3$ and having an off-angled surface that is obtained by rotating an R(1–102) surface about [11–20] axis by a given off-angle; and depositing, on said off-angled surface of the sapphire single crystal substrate, an aluminum nitride single crystal layer by a metal organic chemical vapor deposition to have a (1–210) surface.

According to further aspect of the invention, a surface acoustic wave device includes:

a sapphire single crystal substrate made of $\alpha\text{-}Al_2O_3$ and having an off-angled surface that is obtained by rotating an R(1–102) surface about a [11–20] axis by a given off-angle;

an aluminum nitride single crystal layer deposited on said off-angled surface of the sapphire single crystal substrate by a metal organic chemical vapor deposition and having a (1–210) surface; and interdigital type electrodes formed on the (1–210) surface of the aluminum nitride single crystal layer.

In a preferred embodiment of the substrate for use in a single acoustic wave device according to the invention, the off-angled surface of the sapphire single crystal substrate or wafer is obtained by rotating the R(1–102) surface about the [11–20] axis by the off-angle which is not less than about ±1°, preferably not less than ±2°, and more preferably not less than –3°. It is particularly preferable to set the off-angle to a value within a range from –2° to –10°. It has been experimentally confirmed that the electromechanical coupling coefficient $K^2$ becomes larger and the piezo-electric property becomes better in accordance with an increase in the off-angle in both signs. However, the electromechanical coupling coefficient $K^2$ could not be larger than the electromechanical coupling coefficient inherent to aluminum nitride single crystal itself; it is preferable to set the off-angle to a value within a range from ±4° to –10° as will be explained later.

In another preferable embodiment of the substrate for use in a surface acoustic wave device according to the invention, the aluminum nitride single crystal layer has a double-layer structure consisting of a first aluminum nitride single crystal layer that is deposited on the off-angled surface of the sapphire single crystal substrate and serves as a buffer layer, and a second aluminum nitride single crystal layer formed on said first aluminum nitride single crystal layer. In this case, it is preferable that the first aluminum nitride single crystal layer serving as the buffer layer has a thickness of 5–50 nm, preferably 10 nm and the second aluminum nitride single crystal layer has a thickness not less than 1 $\mu$m. Such a double-layer structure can be easily obtained by merely controlling a surface temperature of the sapphire single crystal wafer while it is maintained within a CVD apparatus. Therefore, the manufacturing cost can be reduced.

It should be noted that the substrate for use in a surface acoustic wave device according to the invention is preferably manufactured by using a sapphire single crystal wafer having a diameter not smaller than 2 $\mu$m, because the advantages of the present invention can be most effective in the case of using such a large wafer.

In the present invention, the off-angled surface of the sapphire single crystal substrate is obtained by rotating the R(1–102) surface about the [11–20] axis by a given off-angle. In the light emitting semiconductor device, it has been proposed to use a sapphire single crystal substrate having a surface that is obtained by rotating the R(1–102) surface about an [1–101] axis by a given off-angle, the [1–101] axis being obtained by projecting the c-axis of sapphire onto the R(1–102) surface. Such an off-angled surface of the sapphire single crystal substrate has been described in Japanese Patent Application Laid-open Publication Hei 4-323880. However, in this known technique, on the off-angled surface of the sapphire single crystal substrate, is deposited a gallium nitride single crystal layer instead of the aluminum nitride single crystal layer. Moreover, in the light emitting semiconductor device, the off-angle is utilized not for preventing the formation of the twins which might cause the disappearance of the piezo-electric property, but for compensating a mis-match in lattice constant between the sapphire single crystal substrate and the gallium nitride single crystal layer.

Further, in the above mentioned Japanese Publication, the off-angle is set to 9.2°, which is rather larger than the preferable range of the off-angle according to the invention.

DESCRIPTION OF THE PREFERRED EMBODIMENTS

Figure 1:
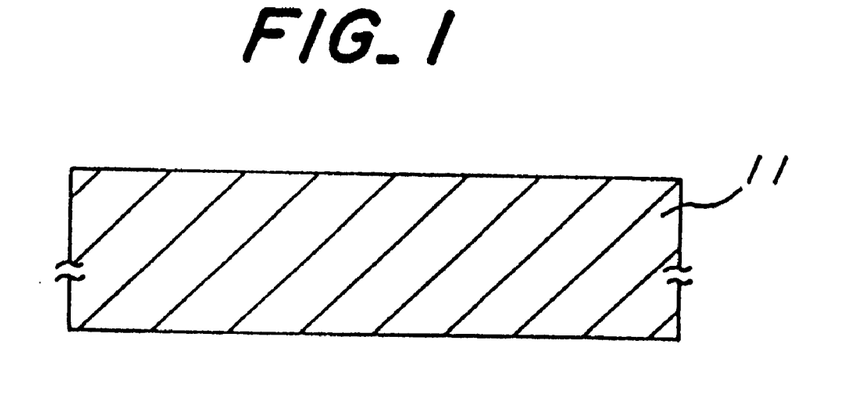
FIG. 1 is a cross sectional view showing a first step of the method of manufacturing the substrate for use in a surface acoustic wave device according to the invention.
Figure 2:
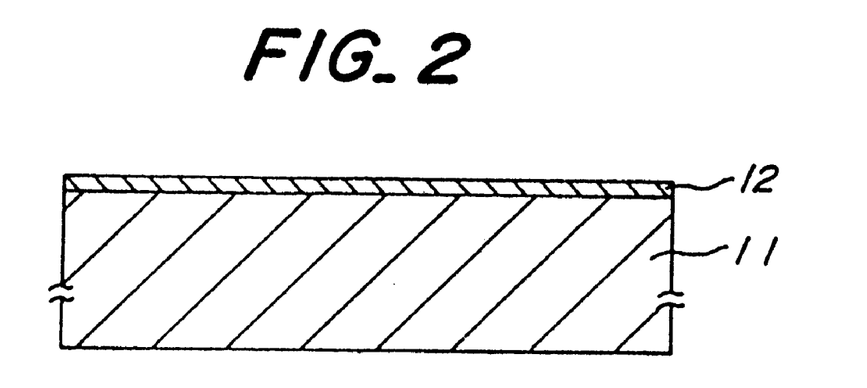
FIG. 2 is a cross sectional view depicting a next step.
Figure 3:
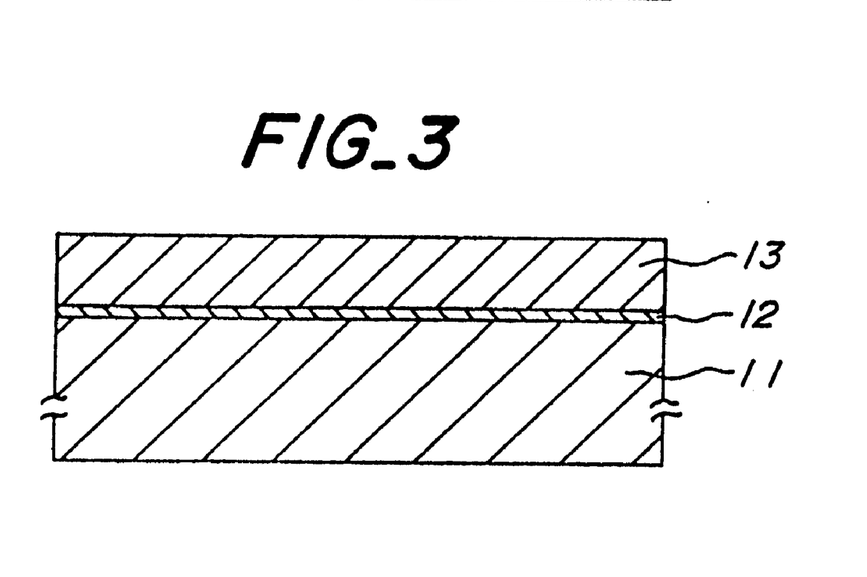
FIG. 3 is a cross sectional view illustrating a next step.

FIGS. 1–3 are cross sectional views showing successive steps of an embodiment of the method according to the invention.

Figure 4:
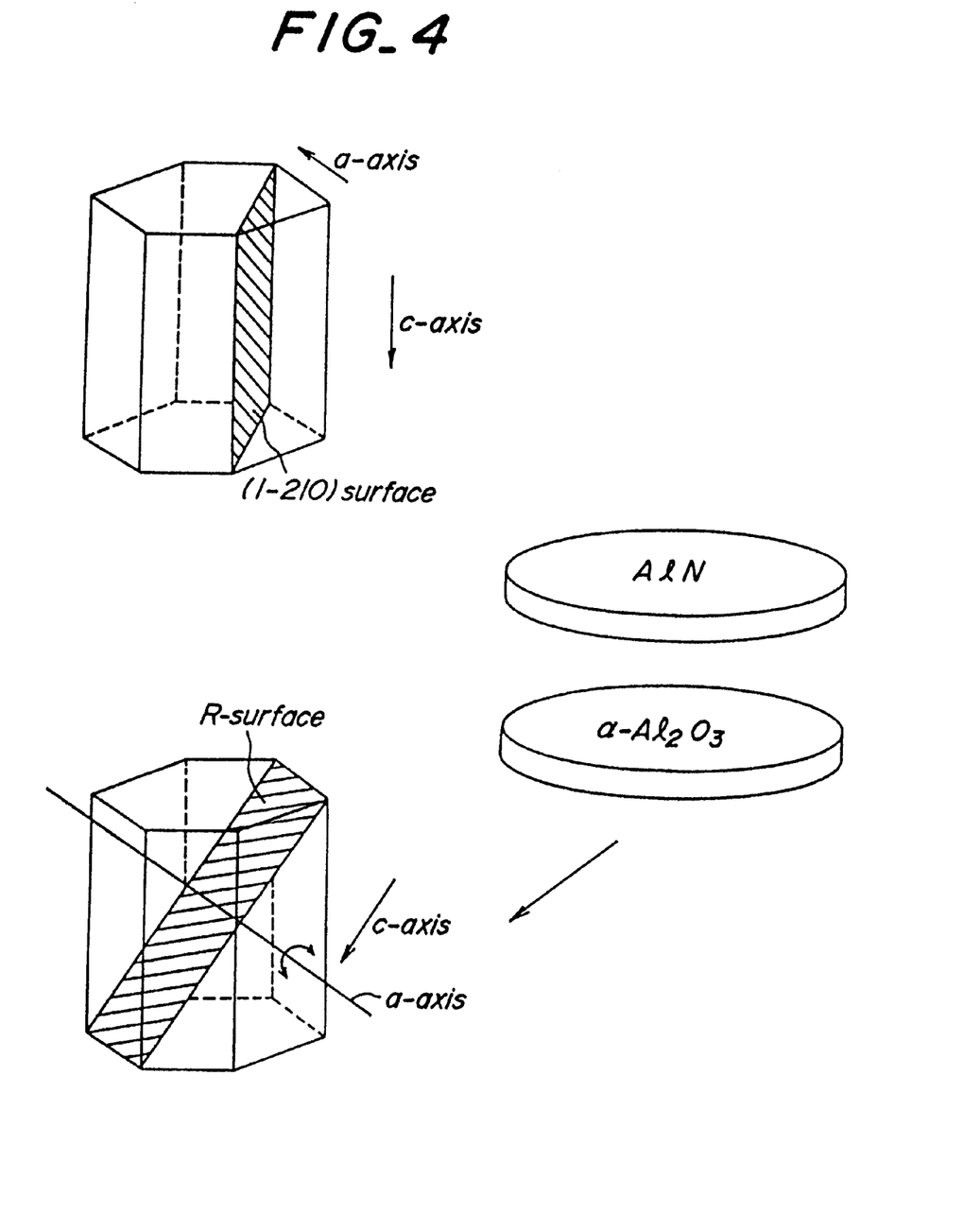
FIG. 4 is a schematic perspective view showing the R(1–102) surface of a sapphire single crystal substrate and the (1–210) surface of an aluminum nitride single crystal layer.

At first, a sapphire single crystal wager 11 made of $\alpha$-$Al_2O_3$ is prepared. The sapphire single crystal wafer 11 has a diameter of two inches and a thickness of about 450 $\mu$m. In the present invention, an aluminum nitride single crystal layer is deposited on an off-angled surface of the sapphire wafer 11, the off-angled surface of the sapphire single crystal substrate being obtained by rotating an R(1–102) surface about a [11–20] axis by a given off-angle. FIG. 4 shows the R(1–102) surface as well as the [11–20] axis of the sapphire wafer 11, [11–20] axis being denoted by an a-axis. As stated above, according to the invention, the R(1–102) surface of the sapphire single crystal wafer is rotated about the a-axis. In this case, the rotation may be performed in both directions, i.e. positive and negative directions as shown by arrows in FIG. 4.

Figure 5:
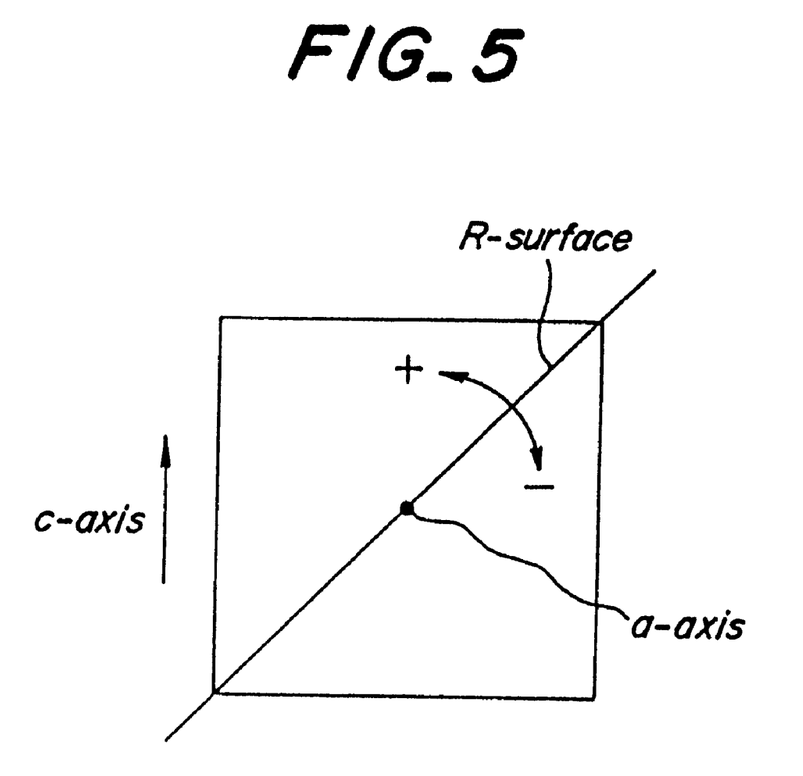
FIG. 5 is a schematic view representing a direction of rotation of the R(1–102) surface of the sapphire substrate about the a-axis to perform the off-angle.
Figure 6A:
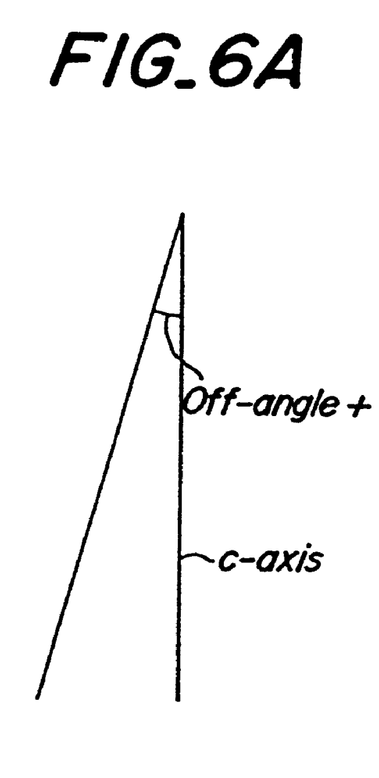
FIGS. 6A, 6B and 6C are schematic views explaining a relation between the R-surface and the c-axis when the R-surface is rotated about the a-axis.
Figures 6B, 6C:
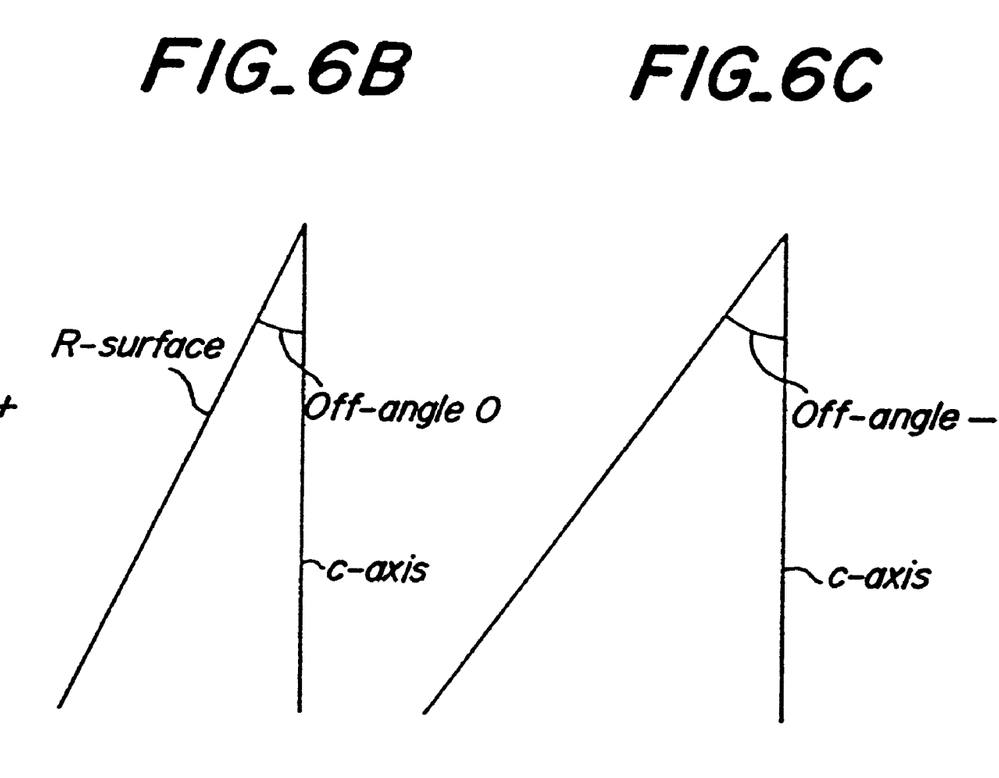

FIG. 5 is a schematic view for defining the direction of the rotation of the R-surface about the a-axis. Here, a rotation in the clockwise direction is denoted as − direction and a rotation in the anti-clockwise direction is denoted as + direction. In FIG. 5, there is also shown a c-axis. A change in an angle between the c-axis and the R-surface in accordance with the rotation angle is shown in FIGS. 6A–6C. FIG. 6B illustrates a case of no or zero off-angle, FIG. 6A shows a case in which the R-surface is rotated in the + direction and FIG. 6C depicts a case in which the R-surface is rotated in the − direction. According to the invention, the R-surface may be rotted in either one of the + and − directions. But, as will be explained later, it is preferable to rotate the R-surface in the − direction, because in this case, it is possible to obtain a large electromechanical coupling coefficient $K^2$ over a wide rage of the off-angle.

Then, as illustrated in FIG. 2, a first aluminum nitride single crystal layer 12 is deposited on the surface of the sapphire single crystal wafer 11 by the metal organic chemical vapor deposition (MOCVD), the surface of the sapphire surface being obtained by rotating the R-surface about the a-axis. In the present embodiment, the first aluminum nitride single crystal layer 12 has a thickness of 10 nm. According to the invention, the first aluminum nitride single crystal layer 12 has preferably a thickness of 5–50 nm. When the first aluminum nitride single crystal layer 12 is deposited on the off-angled R-surface of the sapphire single crystal wafer 11 by MOCVD, the first aluminum nitride single crystal layer 12 has a (1–210) surface. FIG. 4 also shows the (1–210) surface of the aluminum nitride single crystal layer 12.

Next, on the (1–210) surface of the first aluminum nitride single crystal layer 12, is deposited a second aluminum nitride single crystal layer 13 also by MOCVD. Since the second aluminum nitride single crystal layer 13 is deposited on the (1–210) surface of the first aluminum nitride single crystal layer 12, the second aluminum nitride single crystal layer also has a (1–210) surface. The second aluminum nitride single crystal layer 13 has preferably a thickness not less than about 1 $\mu$m. In the present embodiment, the second aluminum nitride single crystal layer 13 has a thickness of 2 $\mu$m. After depositing the first and second aluminum nitride single crystal layers 12 and 13 successively on the sapphire single crystal wafer 1, a desired interdigital type electrode pattern is formed on the (1–210) surface of the second aluminum nitride single crystal layer 13 by means of a conventional method. Then, the sapphire single crystal wafer having the first and second aluminum nitride single crystal layers 12 and 13 and the interdigital electrode patter formed thereon is divided into chips by a conventional slicing technique. The thus obtained chips are placed in packages, given conducting wires are secured to electrodes, and finally the packages are sealed in an air-tight manner. In this manner, a surface acoustic wave device can be obtained on a mass production scale.

Figure 7:
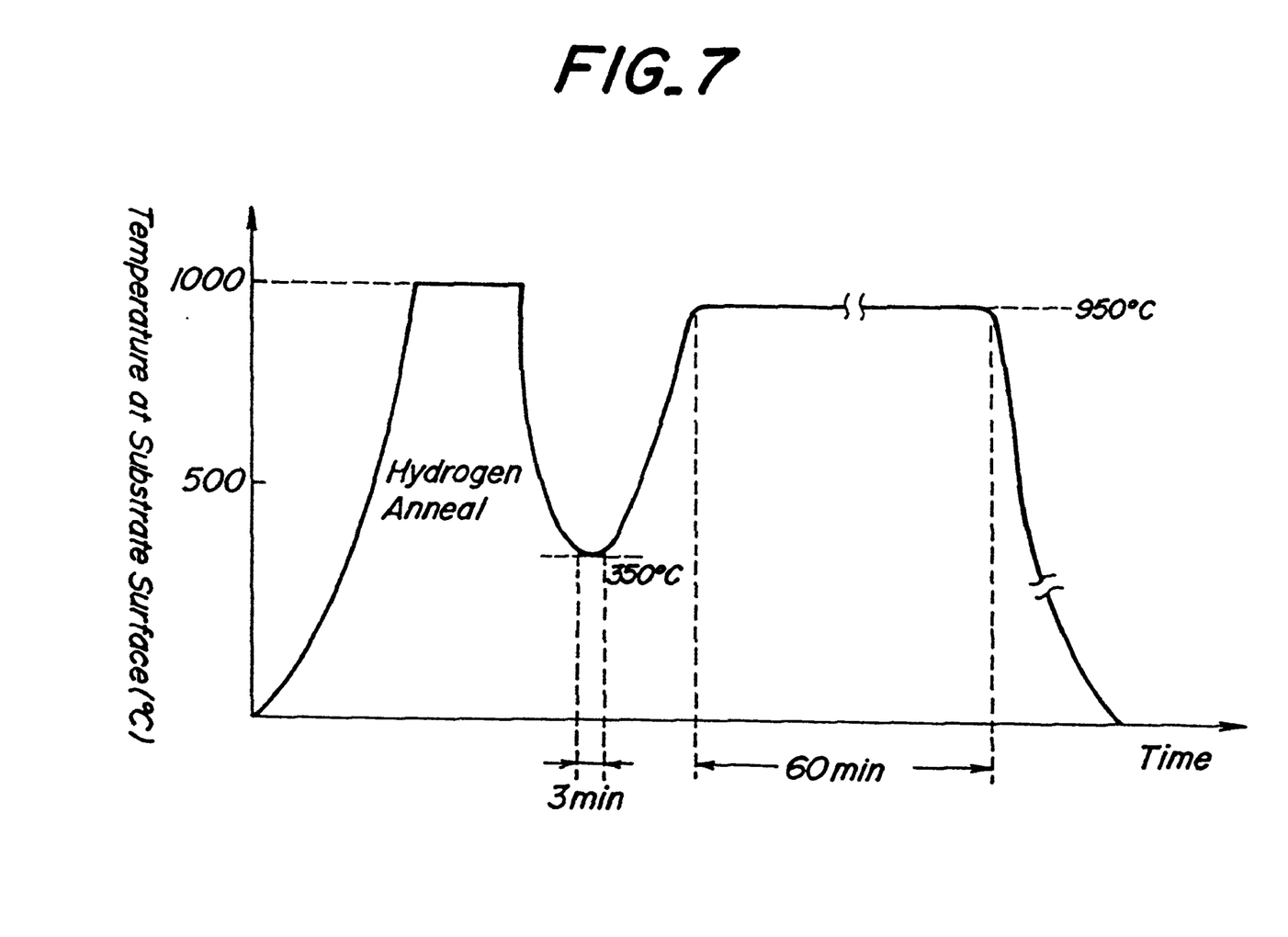
FIG. 7 is a graph showing a change in a surface temperature of the sapphire single crystal substrate during the MOCVD.

Now an example of depositing the first and second aluminum nitride single crystal layers 12 and 13 will be explained with reference to FIG. 7. At first, the sapphire single crystal wafer 11 was introduced into a CVD apparatus and then was heated to a temperature of about 1000° C. Then, a hydrogen gas was introduced into the CVD apparatus to subject the sapphire wafer 11 to the hydrogen annealing. Next, the temperature of the sapphire single crystal wafer 11 was decreased to 300–400° C., particularly about 350° C. Then, trimethylaluminum (TMA) and ammonia (NH3) were introduced into the CVD apparatus for three minutes at flow rates of 100 $\mu$mole/min and 1–5 liters/min, respectively, while hydrogen or nitrogen was used as a carrier gas. During this process, the first aluminum nitride single crystal layer 12 having a thickness of about 10 nm was deposited on the sapphire wafer 11.

Next, the supply of trimethylaluminum and ammonia was temporarily stopped and the sapphire wafer 11 was heated again to 900–1100° C., particularly about 950° C. Then, trimethylaluminum (TMA) and ammonia (NH3) were introduced again into the CVD apparatus for a sixty minutes at the same flow rates of 100 $\mu$mole/min and 1–5 liters/min, respectively, while hydrogen or nitrogen was used as a carrier gas to deposit the second aluminum nitride single crystal layer 13 having a thickness of about 2 $\mu$m. After that, the sapphire single crystal wafer 11 was gradually cooled to a room temperature.

In the manner explained above, the first and second aluminum nitride single crystal layers 12 and 13 can be successively formed without removing the sapphire wafer 11 from the CVD apparatus, and therefore the first and second aluminum nitride single crystal layers are united together and their boundary could not be observed. Therefore, in the substrate for use in a surface acoustic wave device and the surface acoustic wave device according to the present invention, it is determined that only one aluminum nitride single crystal layer is deposited on the sapphire single crystal substrate by MOCVD.

Figure 8:
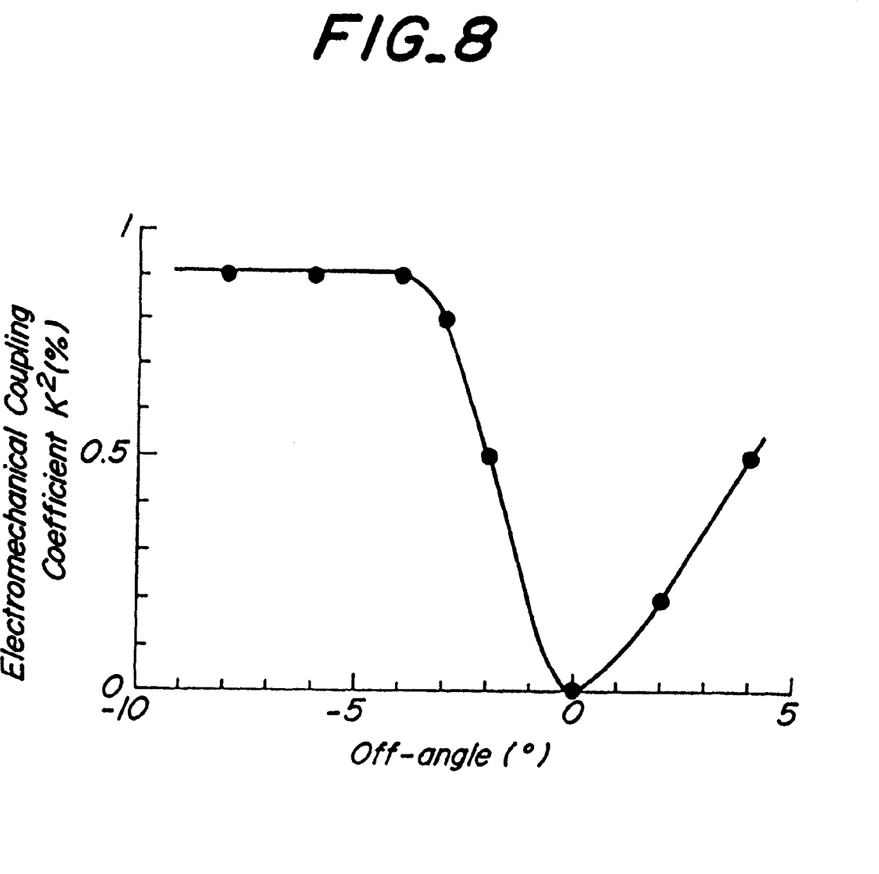
FIG. 8 is a graph showing a relationship between the off-angle and electromechanical coupling coefficient $K^2$.

According to the invention, use is made of the sapphire single crystal substrate or wafer having an off-angled surface that is obtained by rotating the R(1–102) surface about the [11–20] axis by a given off-angle. Now a relationship between the off-angle and the electromechanical coupling coefficient $K^2$ will be explained with reference to a graph shown in FIG. 8. In this graph, a horizontal axis denotes the off-angle which changes from −10° to +4°, and a vertical axis represents the electromechanical coupling coefficient $K^2$ in %. As can be understood from FIG. 8, when the off-angle is zero, i.e. when the R-surface is not rotated, the electromechanical coupling coefficient $K^2$ is zero. That is to say, without the off-angle, the piezo-electric property is lost. When the R-surface is rotated in the + direction and the − direction, the electromechanical coupling coefficient $K^2$ is increased. In this case, it is possible to obtain a higher electromechanical coupling coefficient $K^2$ when the off-angle in the − direction is selected. In the − direction, when the off-angle is larger than 2°, particularly larger than 3°, the electromechanical coupling coefficient $K^2$ becomes larger remarkably. However, when the off-angle is larger than 10°, a possibility that the electromechanical coupling coefficient $K^2$ will be further increased could not be recognized. Therefore, according to the invention, from a practical view point, it is preferable to set the off-angle to be not less than +1°, preferably not less than ±2°, and in the − direction, the off-angle is set to a value not less than 3°. More particularly, the off-angle is preferably set to a value within a range from −2° to −10°. However, it is possible that a desired off-angle will be changed in accordance with conditions in depositing the aluminum nitride single crystal layer. Therefore, the above mentioned off-angle values or ranges are expressed only as preferable examples, and according to the invention it is essential for the sapphire single crystal wafer to have the off-angle that is obtained by rotating the R-surface about the a-axis.

Figure 9:
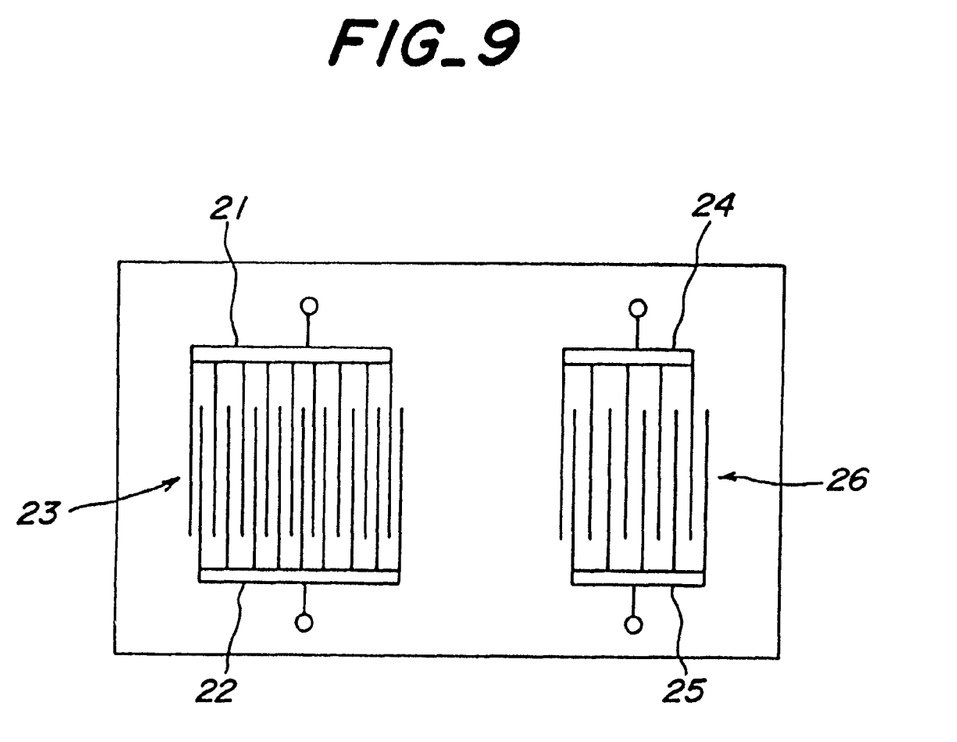
FIG. 9 is a schematic plan view illustrating an embodiment of the surface acoustic wave device according to the invention.

FIG. 9 is a plan view showing an embodiment of the surface acoustic wave device according to the invention. In the present invention, the surface wave acoustic device is formed as a surface acoustic wave filter comprising interdigital type electrodes formed on the aluminum nitride single crystal layer deposited on the sapphire single crystal substrate. In the present embodiment, an input side transducer 23 is formed by regular type interdigital electrodes 21 and 22 whose adjacent electrode fingers are interdigitally crossed with each other, and an output side transducer 26 is arranged to be separated from the input side transducer 21 by a predetermined distance, the output side transducer being also formed by regular type interdigital electrodes 24 and 25 whose adjacent electrode fingers are crossed with each other in an interdigital manner. The aluminum nitride single crystal layer of the substrate has a very high propagating velocity for a surface acoustic wave not lower than 5000 m/sec, and thus by suitably setting the distance between adjacent electrode fingers, it is possible to realize the surface acoustic wave filter having a very high operation frequency of an order of GHz.

The present invention is not limited to the embodiments explained above, but many alternations and modifications may be conceived by those skilled in the art within the scope of the invention. For instance, in the above embodiments, use is made of the sapphire single crystal wafer having a diameter of two inches, but according to the invention a sapphire single crystal wafer having a diameter that is smaller or larger than two inches may be used. As stated above, the advantages of the present invention can be attained effectively when using a large sapphire single crystal wafer; it is preferable to use a sapphire single crystal wafer having a diameter not less than 2 inches.

Moreover, in the above embodiment, the surface acoustic wave device according to the invention is realized as the surface acoustic wave filter having regular type interdigital electrodes, but the surface acoustic wave filter may comprise any other type of electrodes or weighted electrodes. Further, the surface acoustic wave device may be realized as a surface acoustic wave resonator or a delay line.

As explained above in detail, according to the invention, it is possible to provide a aluminum nitride single crystal layer that has no clack, a sufficiently high electromechanical coupling coefficient $K^2$ and a high propagating velocity for the surface acoustic wave even if a sapphire single crystal wafer of not less than two inches is used. Therefore, surface acoustic wave devices having excellent properties and an extremely high operation frequency can be realized at a low cost.

What is claimed is:

1. A method of manufacturing a substrate for a surface acoustic wave device, said substrate comprising a sapphire single crystal substrate made of $\alpha$-$Al_2O_3$ and an aluminum nitride single crystal layer formed on a surface of said substrate, wherein said surface of the sapphire single crystal substrate is formed by an off-angled surface that is obtained by rotating an R(1–102) surface about an (11–20) axis by a given off-angle, and said aluminum nitride single crystal layer is formed by an aluminum nitride single crystal layer deposited on said off-angled surface of the sapphire single crystal substrate by a metal organic chemical vapor deposition to have a (1–210) surface, said method comprising the steps of:

preparing a sapphire single crystal substrate made of $\alpha$-$Al_2O_3$ and having an off-angled surface that is obtained by rotating an R(1–102) surface about an axis by a given off-angle, and depositing, on said off-angled surface of the sapphire single crystal substrate, an aluminum nitride single crystal layer by a metal organic chemical vapor deposition to have a (1–210) surface to form a substrate for a surface acoustic wave device, said substrate comprising a sapphire single crystal substrate made of $\alpha$-$Al_2O_3$ and an aluminum nitride single crystal layer formed on a surface of said substrate, wherein said surface of the sapphire single crystal substrate is formed by an off-angled surface that is obtained by rotating an R(1–102) surface about an (11–20) axis by a given off-angle, and said aluminum nitride single crystal layer is formed by aluminum nitride single crystal layer deposited on said off-angled surface of the sapphire single crystal substrate by a metal organic chemical vapor deposition to have a (1–210) surface.

2. The method according to claim 1, wherein said off-angled surface of the sapphire single crystal substrate is obtained by rotating the R(1–102) surface about the axis by the off-angle which is not less than about ±1°.

3. The method according to claim 1, wherein said off-angled surface of the sapphire single crystal substrate is obtained by rotating the R(1–102) surface about the axis by the off-angle which is not less than about ±2°.

4. The method according to claim 1, wherein said off-angled surface of the sapphire single crystal substrate is obtained by rotating the R(1–102) surface about the axis by the off-angle which is not less than about −3°.

5. The method according to claim 1, wherein said off-angled surface of the sapphire single crystal substrate is obtained by rotating the R(1–102) surface about the axis by the off-angle which is a value within a range from −2° to −10°.

6. The method according to claim 1, wherein said aluminum nitride single crystal layer is formed by a double-layer structure, in which a first aluminum nitride single crystal film serving as a buffer layer is deposited on said off-angled surface of the sapphire single crystal wafer to have the (1–210) surface by the metal organic chemical vapor deposition while the sapphire wafer is heated to a temperature of 300–400° C., preferably about 350° C., and then a second aluminum nitride layer is deposited on said (1–210) surface of the first aluminum nitride single crystal film by the metal organic chemical vapor deposition while the sapphire single crystal wafer is heated to a temperature of 900–1100° C., particularly about 950° C., wherein said first and second aluminum nitride single crystal layers are successively formed without removing the sapphire single crystal wafer from a chemical vapor deposition apparatus.

7. The method according to claim 6, wherein said sapphire single crystal wafer has a diameter not less than two inches (50.8 mm), said first aluminum nitride single crystal layer is deposited to have a thickness of 5–50 nm, particularly about 10 nm, and said second aluminum nitride single crystal layer is deposited to have a thickness not less than 1 $\mu$m.

* * * * *